(12) United States Patent
Min et al.

(10) Patent No.: US 7,364,977 B2
(45) Date of Patent: Apr. 29, 2008

(54) HETEROJUNCTION BIPOLAR TRANSISTOR AND METHOD OF FABRICATING THE SAME

(75) Inventors: Byoung-Gue Min, Daejeon (KR);
Kyung-Ho Lee, Daejeon (KR);
Seong-Il Kim, Daejeon (KR);
Jong-Min Lee, Daejeon (KR);
Chul-Won Ju, Daejeon (KR)

(73) Assignee: Electronics and Telecommunications Research Institute (KR)

( * ) Notice: Subject to any disclaimer, the term of this patent is extended or adjusted under 35 U.S.C. 154(b) by 161 days.

(21) Appl. No.: 10/857,655

(22) Filed: May 28, 2004

(65) Prior Publication Data
US 2005/0133820 A1    Jun. 23, 2005

(30) Foreign Application Priority Data
Dec. 19, 2003    (KR) .............. 10-2003-0094071

(51) Int. Cl.
*H01L 21/8222*    (2006.01)
(52) U.S. Cl. .................. 438/312; 257/197
(58) Field of Classification Search ........ 438/312, 438/320, 364; 257/197, 198
See application file for complete search history.

(56) References Cited

U.S. PATENT DOCUMENTS 4,751,201 A    6/1988  Nottenburg et al.
5,150,185 A *  9/1992  Yamada ............. 257/197
5,949,097 A *  9/1999  Hirata et al. ......... 257/198
6,998,320 B2 * 2/2006  Krueger et al. ...... 438/312

FOREIGN PATENT DOCUMENTS

JP    10-0347520       8/2002
KR    010076080 A      8/2001

OTHER PUBLICATIONS

J. Appl. Phys. 74 (9), Nov. 1, 1993, pp. 5602-5605.
Hideki Fukano, et al., "Surface Currents in InP/InGaAs Heterojunction Bipolar Transistors Produced by Passivatino Film Formation", Jpn. J. Appl. vol. 32 (1993) pp. L 1788-L 1791, Part 2, No. 12B, Dec. 15, 1993.

* cited by examiner

*Primary Examiner*—Phuc T. Dang
(74) *Attorney, Agent, or Firm*—Blakely, Sokoloff, Taylor & Zafman

(57) ABSTRACT

Disclosed are a heterojunction bipolar transistor and a method of fabricating the same. A first dielectric layer easily etched is deposited on the overall surface of a substrate before an isolation region is defined. The first dielectric layer and a sub-collector layer are selectively etched, and then a second dielectric layer etched at a low etch rate is deposited on the overall surface of the substrate. Via holes are formed in the first and second dielectric layers, and then the first dielectric layer is removed using a difference between etch characteristics of the first and second dielectric layers. Accordingly, a reduction in power gain, generated at the interface of a compound semiconductor and a dielectric insulating layer (the second dielectric layer), can be eliminated.

6 Claims, 6 Drawing Sheets

PRIOR ART

HETEROJUNCTION BIPOLAR TRANSISTOR AND METHOD OF FABRICATING THE SAME

CROSS REFERENCE TO RELATED APPLICATION

This application claims priority to and the benefit of Korea Patent Application No. 2003-94071 filed on Dec. 19, 2003 in the Korean Intellectual Property Office, the content of which is incorporated herein by reference.

BACKGROUND OF THE INVENTION (a) Field of the Invention

The present invention relates to a heterojunction bipolar transistor and a method of fabricating the same. More specifically, the present invention relates to a heterojunction bipolar transistor using a compound semiconductor and a method of fabricating the same.

(b) Description of the Related Art

A heterojunction bipolar transistor using a compound semiconductor such as GaAs and InP is actively used as an essential element having various functions for communications because the heterojunction bipolar transistor has very high speed, very high frequency, large current driving capability, signal linearity, and uniform operation voltage. For instance, the heterojunction bipolar transistor is used as a high-efficiency large-power amplifier in an output amplifier of a mobile terminal. Furthermore, a mixed signal heterojunction bipolar transistor technique greatly affects the construction of an optical communication system. The heterojunction bipolar transistor is disclosed in Korean Patent No. 347520. FIG. 1 is a cross-sectional view of the heterojunction bipolar transistor.

To fabricate the heterojunction bipolar transistor shown in FIG. 1, a sub-collector layer 102, a collector layer 103, a base layer 104, an emitter layer 105, and an emitter cap layer 106 are sequentially epitaxial-grown on a compound semiconductor substrate 101. An emitter electrode 111 is formed on the emitter cap layer 106. Then, the emitter cap layer 106 and the emitter layer 105 are etched into a mesa, and base electrodes 112 are formed on the base layer 104. Subsequently, the base layer 104 and the collector layer 103 are etched into a mesa, and collector electrodes 113 are formed on the sub-collector layer 102. Then, a predetermined isolation region is defined, and a dielectric insulating layer 121 is formed on the overall surface of the substrate. Finally, via holes are formed in the insulating layer 121 to expose the emitter, base, and collector electrodes, and a metal 122 is deposited or plated on the exposed emitter, base, and collector electrodes to form transmission lines. The transmission lines 122 are connected to other active or passive elements of the transistor.

In the above-described conventional method of fabricating the heterojunction bipolar transistor, the dielectric insulating layer 121 forms interfaces with the side of the emitter mesa, the side of the base-collector mesa, the exposed portion of the surface of the emitter layer, the exposed portion of the surface of the base layer, and the exposed portion of the surface of the sub-collector layer. The dielectric insulating layer 121 is formed of SiO2, Si3N4, or SiOxNy. However, recombination sites are formed at the interface of the compound semiconductor and the dielectric insulating layer because bonding coherence or smooth transition between the compound semiconductor and the dielectric insulating layer is difficult to form at the interface. This reduces a current gain of the bipolar transistor.

FIGS. 2a and 2b respectively show DC current gains before and after deposition of a SiNx dielectric insulating layer of a heterojunction bipolar transistor having an InP emitter layer and an InGaAs base layer. FIGS. 2a and 2b show a collector current Ic, a base current Ib, and a current gain according to a variation in a base-emitter voltage Vbe. The current gain corresponds to a value obtained by dividing the collector current Ic by the base current Ib. As shown in FIGS. 2a and 2b, the current gain after deposition of the SiNx dielectric insulating layer is considerably reduced as the base current Ib is increased, compared to the current gain before deposition of the SiNx insulating layer. This is because of a strong interaction of the insulating layer and an extrinsic base surface having a large surface recombination rate due to a high doping concentration ($10^{19}$ to $10^{20}$ cm$^{-3}$), such as at the side of the base-collector mesa and the exposed portion of the surface of the base layer. The surface recombination effect becomes stronger as the size of the transistor is decreased in order to improve the performance of the transistor.

To reduce the interface effect, a conventional technique has employed interface control layers. Specifically, a method of forming an interface layer between a compound semiconductor and an insulating layer was used. The interface layer is formed of one of the following combination layers.

1) Oxide or insulator interface control layers such as $Al_2O_3/In(PO_3)_3/InP$, $SiO_2/ECR$ oxide/InP, SiNx/anodic oxide/InP, and SiNx/PN/sulfur-treated InP.

2) Interface control layers including sulfur such as $SiO_2/S/InP$, $SiO_2/SiS_2/InP$, $Si_3N_4$/polysulfide/InP, and SiNx/InS/InP.

3) Interface control layers using an ultra thin Si layer such as $SiO_2$/Si/InGaAs, $Si_3N_4$/Si/InGaAs, $SiO_2/Si_3N_4$/Si/InGaAs, $SiO_2$/Si/InP, and $Si_3N_4$SiNx/Si/InP.

Although the conventional interface control layer forming technique appropriately compensates a difference between the compound semiconductor and the insulating layer to prevent interface characteristic from being abruptly varied, the conventional technique is not an appropriate method for solving the aforementioned problem. That is, the problem caused by the surface recombination effect is not solved because of non-continuity between the compound semiconductor and interface control layer and between the interface control layer and the insulating layer.

SUMMARY OF THE INVENTION

It is an object of the present invention to provide a heterojunction bipolar transistor using a compound semiconductor, and a method of fabricating the same.

In one aspect of the present invention, a method of fabricating a heterojunction bipolar transistor comprises sequentially forming a sub-collector layer, a collector layer, a base layer, an emitter layer, and an emitter cap layer on a substrate; forming an emitter electrode on a first region of the emitter cap layer; selectively etching the emitter cap layer and the emitter layer to expose a portion of the base layer; forming a base electrode on a second region of the exposed portion of the base layer; selectively etching the base layer and the collector layer to expose a portion of the sub-collector layer; forming a collector electrode on a third region of the exposed portion of the sub-collector layer; forming a first dielectric layer on the overall surface of the substrate; selectively etching the first dielectric layer and the sub-collector layer to define an isolation region; forming a second dielectric layer on the overall surface of the substrate; selectively etching the second dielectric layer to form via holes on the emitter, base, and collector electrodes, respectively; and etching the first dielectric layer through the via holes.

In another aspect of the present invention, a heterojunction bipolar transistor comprises a sub-collector layer formed on a substrate; a collector layer formed on a first region of the sub-collector layer; a collector electrode formed on a second region of the sub-collector layer; a base layer formed on the collector layer; an emitter layer formed on a third region of the base layer; a base electrode formed on a fourth region of the base layer; an emitter cap layer formed on the emitter layer; an emitter electrode formed on a fifth region of the emitter cap layer; and a first dielectric layer formed on the substrate, the first dielectric layer having via holes that expose at least portions of the collector, base, and emitter electrodes. There is a predetermined gap between the first dielectric layer and at least a portion of the surface of the sub-collector layer, the surface of the emitter layer, the side of the collector layer, the side of the base layer, the side of the emitter layer, and the side of the emitter cap layer.

BRIEF DESCRIPTION OF THE DRAWINGS

The accompanying drawings, which are incorporated in and constitute a part of the specification, illustrate an embodiment of the invention, and, together with the description, serve to explain the principles of the invention.

DETAILED DESCRIPTION OF THE PREFERRED EMBODIMENTS

Figure 1:
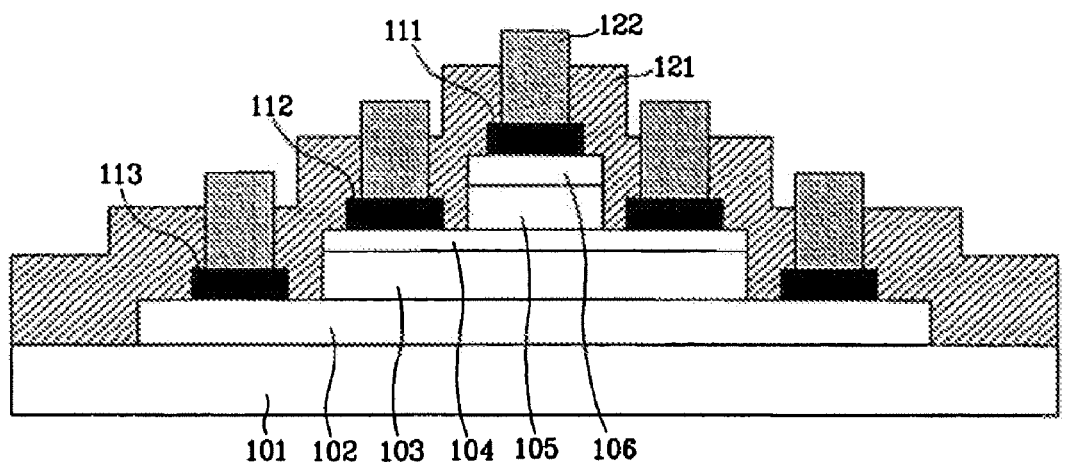
FIG. 1 is a cross-sectional view of a conventional heterojunction bipolar transistor.
Figure 2A:
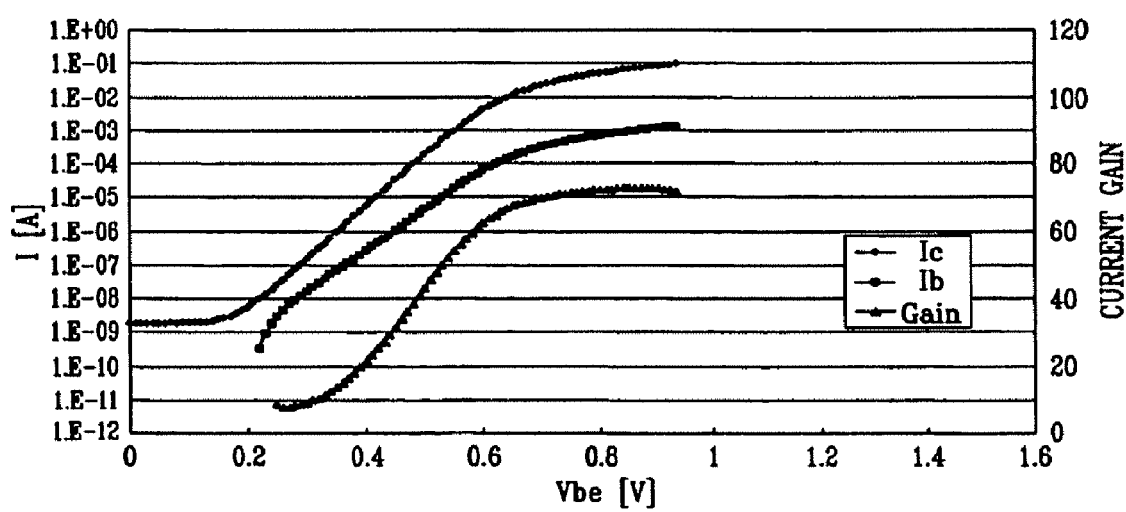
FIGS. 2a and 2b respectively show DC current gains before and after deposition of a dielectric insulating layer of a heterojunction bipolar transistor.
Figure 2B:
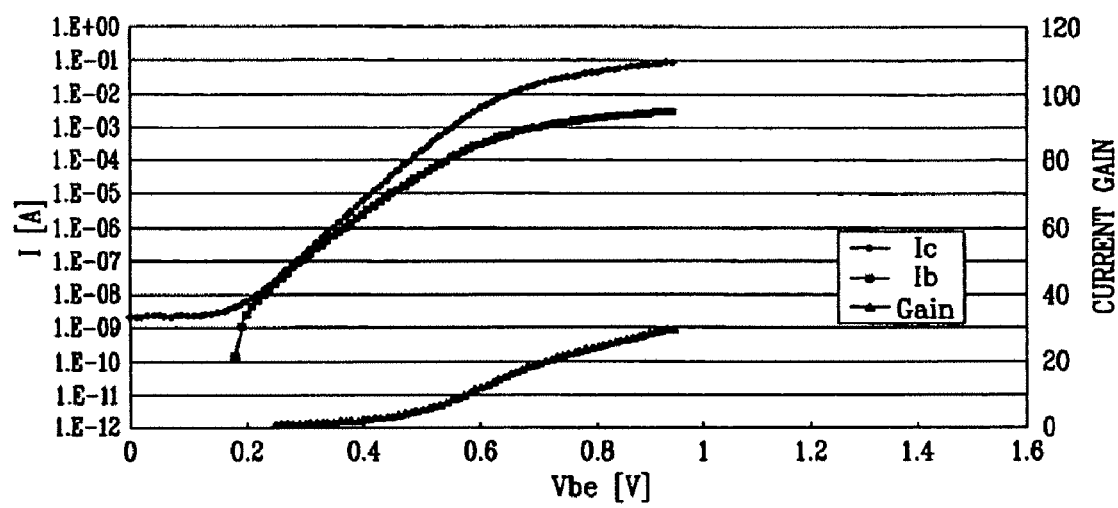

In the following detailed description, only the preferred embodiment of the invention has been shown and described, simply by way of illustration of the best mode contemplated by the inventor(s) of carrying out the invention. As will be realized, the invention is capable of modification in various obvious respects, all without departing from the invention. Accordingly, the drawings and description are to be regarded as illustrative in nature, and not restrictive.

In the drawings, thicknesses of layers and regions are exaggerated for clarity. It will also be understood that when a layer is referred to as being "on" another layer or substrate, it can be directly on the other layer or substrate, or intervening layers may also be present. Like reference numerals in the drawings denote like elements, and thus their description will be omitted.

A heterojunction bipolar transistor and a method of fabricating the same according to an embodiment of the present invention are explained below.

FIGS. 3 through 14 are cross-sectional views showing a process of fabricating the heterojunction bipolar transistor according to the embodiment of the present invention.

Figure 3:
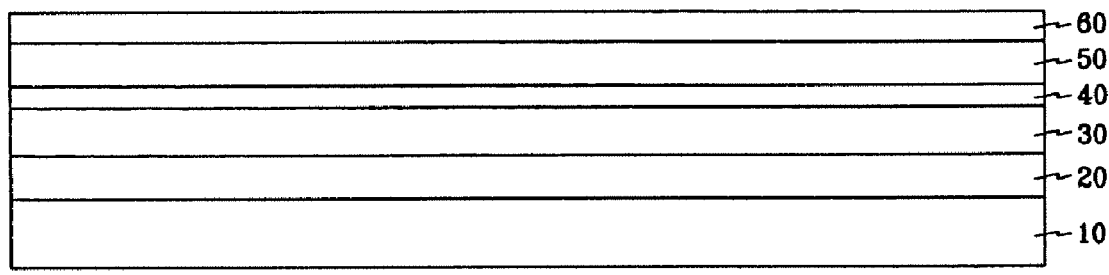
FIGS. 3 through 14 are cross-sectional views showing a process of fabricating a heterojunction bipolar transistor according to an embodiment of the present invention.

Referring to FIG. 3, a sub-collector layer 20, a collector layer 30, a base layer 40, an emitter layer 50, and an emitter cap layer 60 are sequentially formed on a semiconductor substrate 10. These layers 20, 30, 40, 50, and 60 are grown on the semiconductor substrate 10 using an epitaxial growth such as molecular beam epitaxy (MBE) and metal organic chemical vapor deposition (MOCVD). The emitter cap layer 60 is formed for the purpose of reducing a contact resistance between the emitter layer 50 and an emitter electrode that will be formed later. Thus, the emitter cap layer 60 can be omitted.

The substrate 10 is an electrically semi-insulating compound semiconductor substrate. A GaAs or InP compound semiconductor substrate can be used as the substrate 10. Each of the sub-collector layer 20, collector layer 30, base layer 40, emitter layer 50, and emitter cap layer 60 can be formed of a combination of various III-V compound semiconductors, such as GaAs, InP, InAlAs, InGaAs, InGaP, AlGaAs, and so on, to construct the heterojunction bipolar transistor on the substrate 10.

For example, in the case of a GaAs substrate 10, an n+ GaAs sub-collector layer 20, an n-type GaAs collector layer 30, and a p+ GaAs base layer 40 are sequentially grown on the GaAs substrate 10. Subsequently, an n-type AlGaAs emitter layer 50 and an n+ InGaAs emitter cap layer 60 are grown on the emitter layer 50. In the case of a InP substrate, the sub-collector layer 20, collector layer 30, and base layer are formed of AlGaAs on the InP substrate, and an InP emitter layer 50 and an InGaAs emitter cap layer 60 are sequentially grown thereon.

Figure 4:
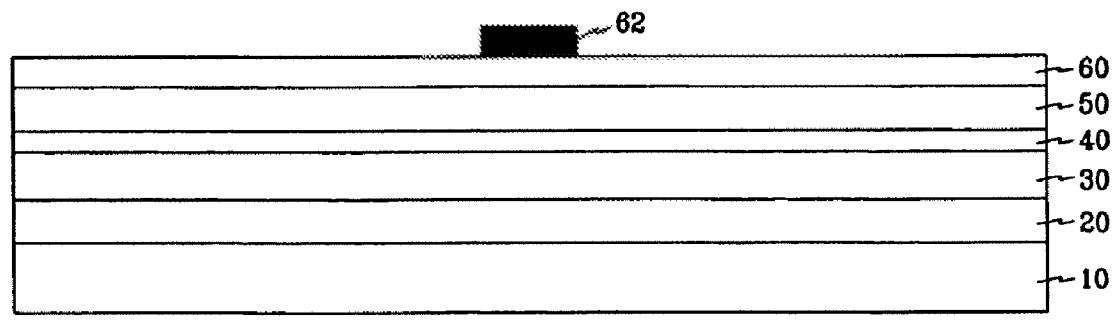

Referring to FIG. 4, an emitter electrode 62 is formed on a predetermined region of the emitter cap layer 60. Specifically, the emitter electrode 62 is formed in such a manner that a conventional electrode material is deposited and patterned through photolithography and lift-off processes. The emitter electrode 62 can be formed of Ti/Pt/Au, Au—Ge, Pd/In, Al/Ni/Ge, Ni/Au—Ge, or Pd/Au—Ge.

Figure 5:
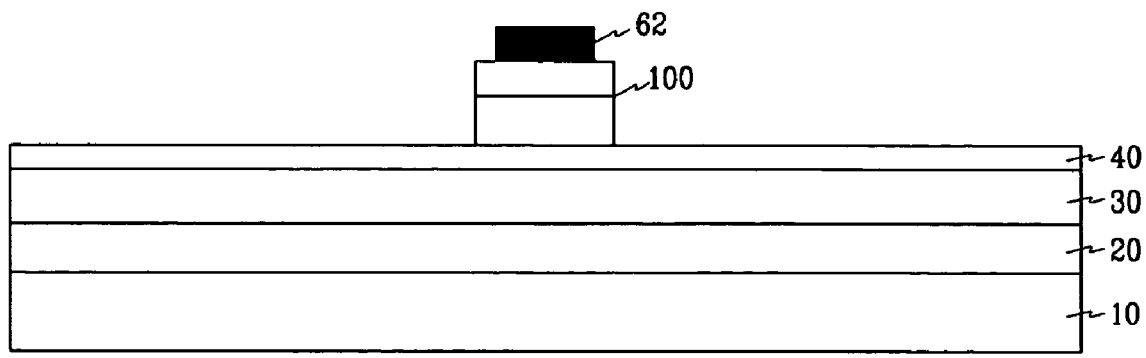

Referring to FIG. 5, the emitter cap layer 60 and the emitter layer 50 are selectively etched using the emitter electrode 62 or a predetermined photoresist pattern (not shown) formed by photolithography as a mask, to form an emitter mesa, that is, an intrinsic base region.

Figure 6:
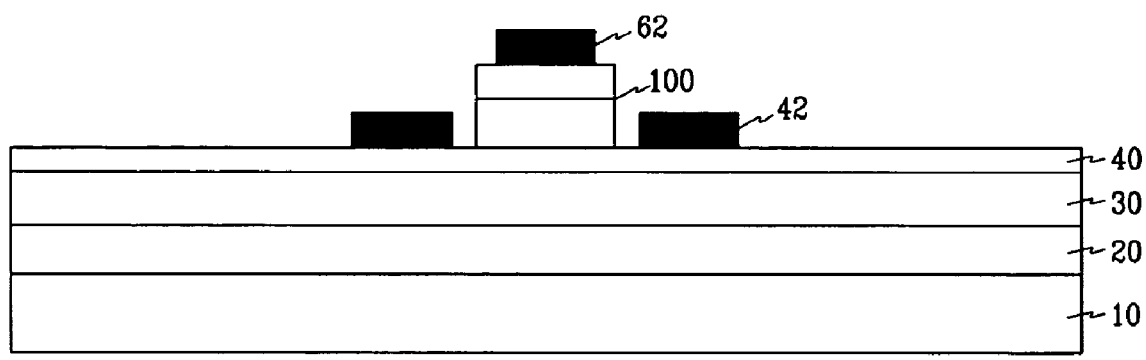
Figure 7:
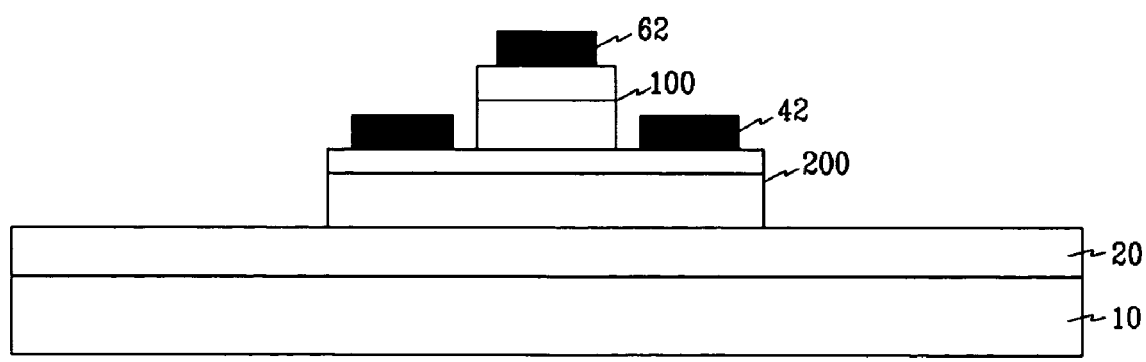

Referring to FIG. 6, base electrodes 42 are formed of a conventional electrode material on predetermined regions of the base layer 40. As shown in FIG. 7, predetermined portions of the base layer 40 and collector layer 30 are selectively etched to form a base-collector mesa 200.

Figure 8:
Figure 9:
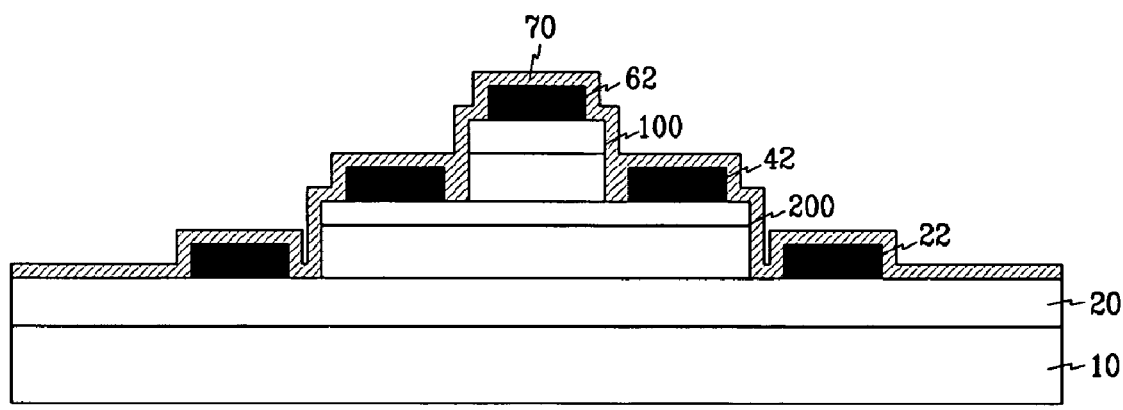

Referring to FIG. 8, collector electrodes 22 are formed of a conventional electrode material on predetermined regions of the sub-collector layer 20. Referring to FIG. 9, a dielectric layer 70 is coated by tens of nm on the overall surface of the substrate 10. The dielectric layer 70 is formed of an oxide or a nitride.

Figure 10:
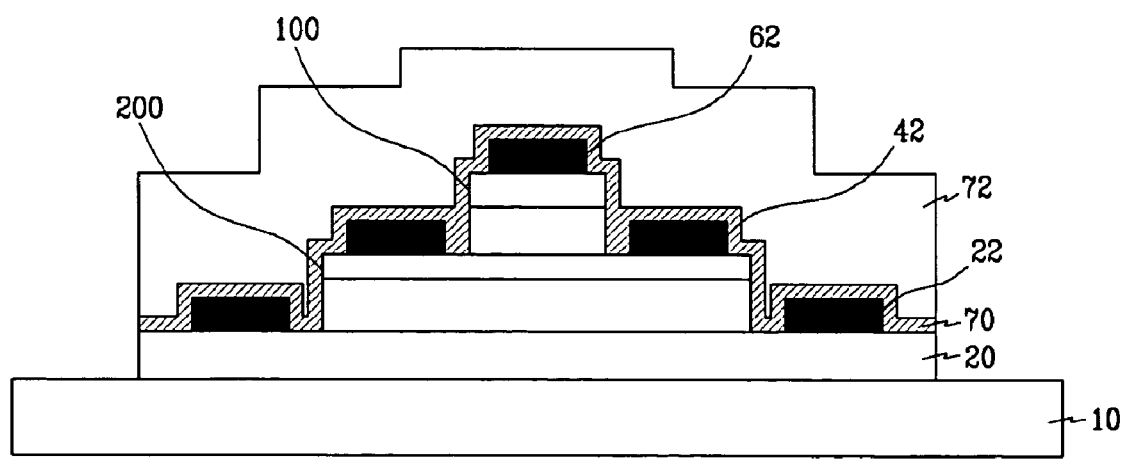

Referring to FIG. 10, a photoresist pattern 72 is formed as an etch mask on the dielectric layer 70 formed on the emitter electrode 62, base electrode 42, and collector electrode 22 in order to define an isolation region. Then, exposed portions of the dielectric layer 70 and sub-collector layer 20 are sequentially etched using the photoresist pattern 72 as a mask. The dielectric layer 70 can be etched through dry etching such as reactive ion etching (RIE) or wet etching using a buffered oxide etchant (BOE). The sub-collector 20 can be also etched using dry etching or wet etching.

Figure 11:
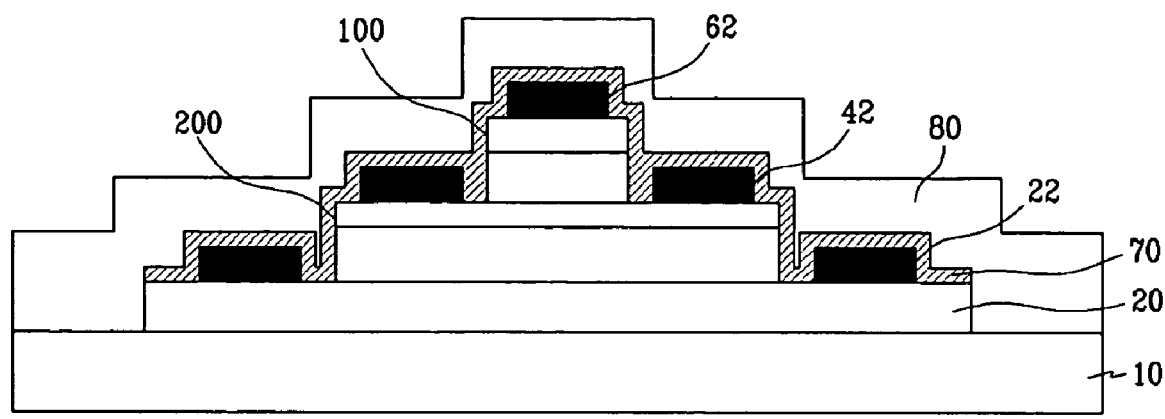

Referring to FIG. 11, the photoresist pattern is removed, and then a dielectric layer 80 is coated on the dielectric layer 70. The dielectric layer 80 is formed of a material different from the dielectric layer 70 through a deposition method and conditions different from those of the dielectric layer 70, such that the dielectric layer 80 is harder to etch than the dielectric layer 70 or an etch rate of the dielectric layer 80 is lower than that of the dielectric layer 70. For instance, if the dielectric layer 70 is formed of SiOx rapidly deposited at the normal temperature, the dielectric layer 80 can be formed of $Al_2O_3$ slowly deposited at a high temperature.

Figure 12:
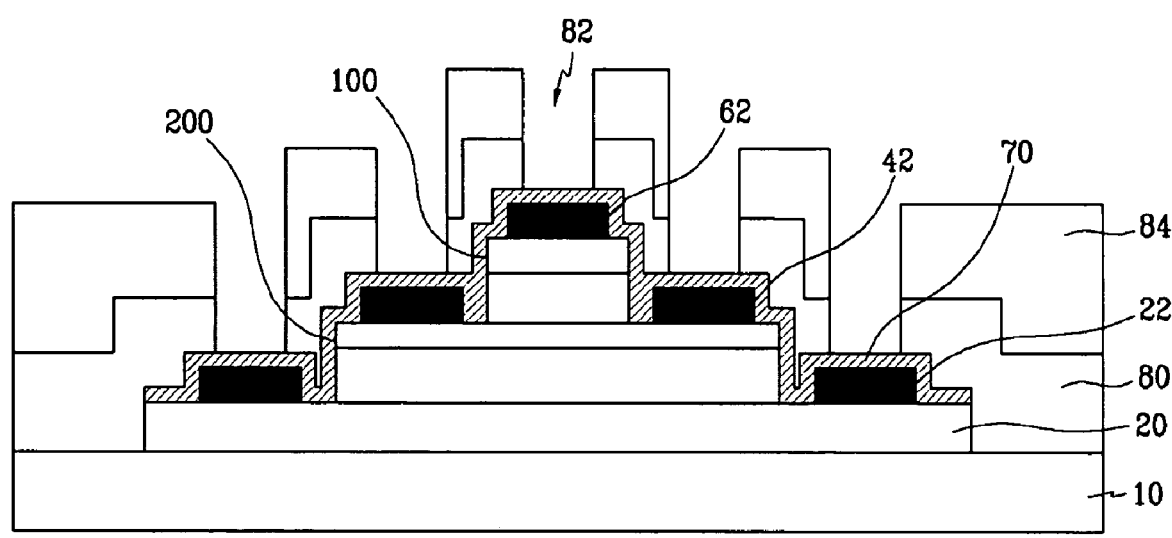

Referring to FIG. 12, via holes 82 that connect the emitter, base, and collector electrodes 62, 42, and 22 to other elements of the bipolar transistor are formed. Specifically, a photoresist pattern 82 is formed as a mask on the dielectric layer 80 through photolithography, and the dielectric layer 80 is etched using the photoresist pattern 84 as a mask such that the etched dielectric layer 80 has no undercut, to form the via holes 82. It is preferable that the via holes 82 have vertical cross sections. For this, inductively coupled plasma (ICP) using a high induced bias or RIE dry etching are used to form the via holes. Here, the portions of the dielectric layer 80 in which the via holes 82 are formed must be removed. On the other hand, the portions of the dielectric layer 70 formed under the dielectric layer 80, in which the via holes are formed, can be partially or completely removed.

Figure 13:
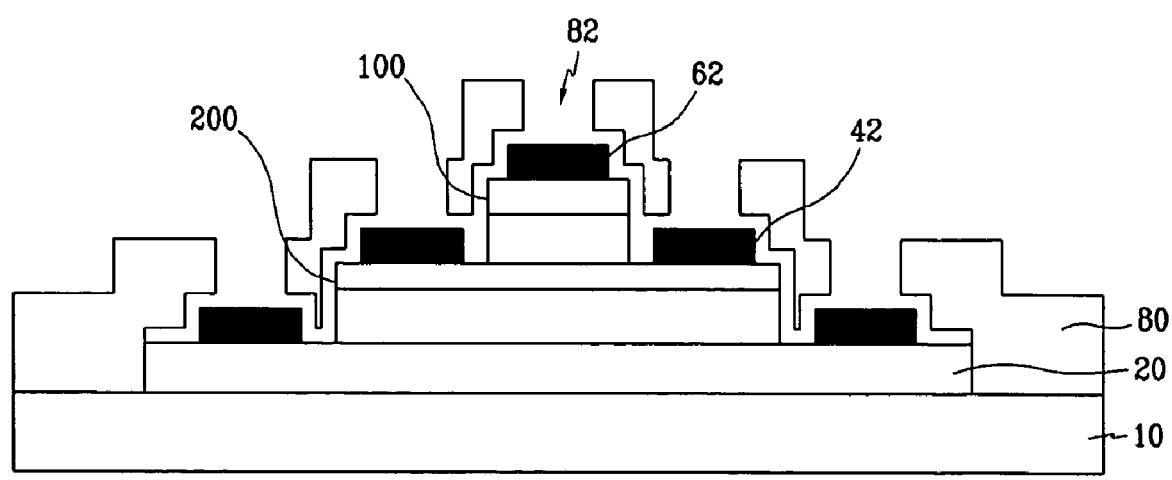

Referring to FIG. 13, the dielectric layer 70 and the photoresist pattern are removed through the via holes 82. The dielectric layer 70 is etched through wet etching using a BOE or dry etching having isotropic etch characteristics. Then, the dielectric layer 80 is etched at an etch rate considerably lower than the etch rate of the dielectric layer 70. Here, when the dielectric layer 70 is etched, a specific gap is formed between the dielectric layer 80 and the side of the emitter mesa 100, the side of the base-collector mesa 200, the exposed portion of the surface of the base layer 40, and the exposed portion of the surface of the sub-collector layer 20. If the dielectric layer 70 is not completely etched, the dielectric layer 70 is partially left in the gap.

Figure 14:
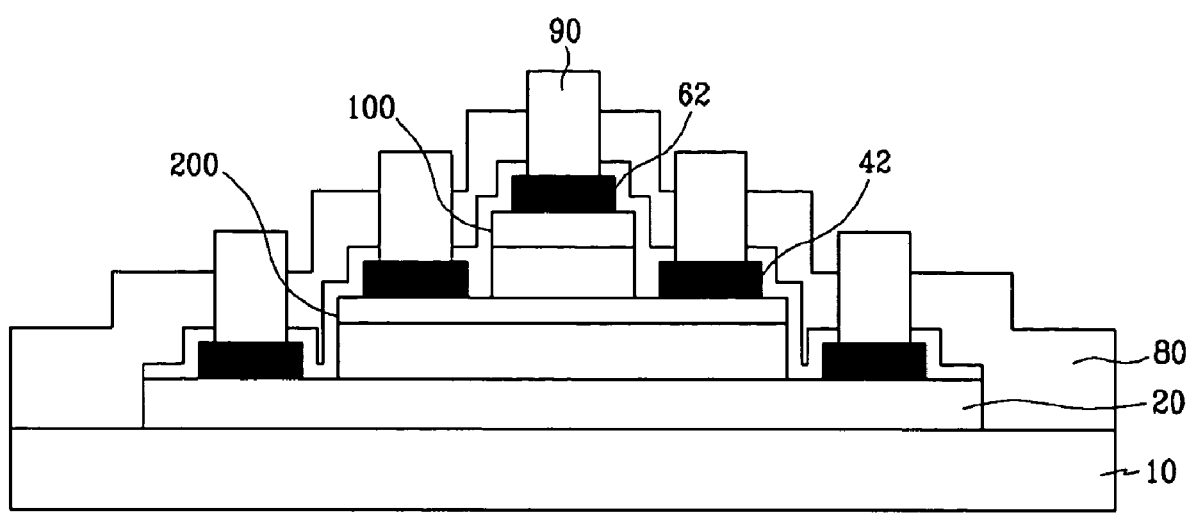

Referring to FIG. 14, transmission lines 90 are connected to the emitter, base, and collector electrodes 62, 42, and 22 to achieve the heterojunction bipolar transistor according to the present invention.

As described above, the present invention can reduce a surface recombination current generated at the interface of the surface of a compound semiconductor and an insulating layer so as to improve a DC current gain of a heterojunction bipolar transistor. Accordingly, the performance of the heterojunction bipolar transistor can be maximized.

While this invention has been described in connection with what is presently considered to be the most practical and preferred embodiment, it is to be understood that the invention is not limited to the disclosed embodiments, but, on the contrary, is intended to cover various modifications and equivalent arrangements included within the spirit and scope of the appended claims.

What is claimed is:

1. A method of fabricating a heterojunction bipolar transistor, comprising:
    sequentially forming a sub-collector layer, a collector layer, a base layer, an emitter layer, and an emitter cap layer on a substrate;
    forming an emitter electrode on a first region of the emitter cap layer; selectively etching the emitter cap layer and the emitter layer, to expose a portion of the base layer;
    forming a base electrode on a second region of the exposed portion of the base layer;
    selectively etching the base layer and the collector layer, to expose a portion of the sub-collector layer;
    forming a collector electrode on a third region of the exposed portion of the sub-collector layer;
    forming a first dielectric layer on the overall surface of the substrate;
    selectively etching the first dielectric layer and the sub-collector layer, to define an isolation region;
    forming a second dielectric layer on the overall surface of the substrate;
    selectively etching the second dielectric layer, to form via holes on the emitter, base, and collector electrodes, respectively; and
    forming a gap under the second dielectric layer by removing at least a portion of the first dielectric layer through the via holes.

2. The method as claimed in claim 1, wherein the first dielectric layer is etched faster than the second dielectric layer.

3. The method as claimed in claim 1, wherein the first dielectric layer is etched easier than the second dielectric layer.

4. The method as claimed in claim 1, wherein the first dielectric layer is formed on the surface of the emitter layer around the emitter electrode, the surface of the base layer around the base electrode, the surface of the collector layer around the collector electrode, the side of the etched emitter cap layer and emitter layer, and the side of the etched base layer and collector layer.

5. The method as claimed in claim 1, wherein the emitter cap layer and the emitter layer are etched into a mesa, and the base layer and the collector layer are also etched into a mesa.

6. The method as claimed in claim 1, wherein the first dielectric layer is deposited rapidly at the normal temperature and the second dielectric layer is deposited slowly at a high temperature.

* * * * *